United States Patent [19]
Lowrey et al.

[11] Patent Number: 5,360,992
[45] Date of Patent: Nov. 1, 1994

[54] TWO PIECE ASSEMBLY FOR THE SELECTION OF PINOUTS AND BOND OPTIONS ON A SEMICONDUCTOR DEVICE

[75] Inventors: Tyler A. Lowrey, Boise, Id.; Alan R. Reinberg, Westport, Conn.; Kevin D. Martin, Boise, Id.

[73] Assignee: Micron Technology, Inc., Boise, Id.

[21] Appl. No.: 221,974

[22] Filed: Apr. 1, 1994

Related U.S. Application Data

[63] Continuation of Ser. No. 811,768, Dec. 20, 1991, abandoned.

[51] Int. Cl.$^5$ .................... H01L 23/48; H01L 29/44; H01L 29/52; H01L 29/60
[52] U.S. Cl. ................................ 257/666; 257/698; 257/692
[58] Field of Search ............... 257/691, 698, 692, 693, 257/690, 666

[56] References Cited

U.S. PATENT DOCUMENTS

| | | | |
|---|---|---|---|
| 3,663,868 | 5/1972 | Noguchi et al. | 257/698 |
| 4,901,136 | 2/1990 | Neugebauer et al. | 257/691 |
| 4,922,324 | 5/1990 | Sudo | 257/698 |
| 5,045,921 | 9/1991 | Lin et al. | 257/698 |
| 5,302,849 | 4/1994 | Covasin | 257/676 |

OTHER PUBLICATIONS

"Z-Axis Conductive Adhesive" Zymet Inc., 7 Great Meadow Lane, E. Hanover, N.J. 07936.

*Primary Examiner*—Andrew J. James
*Assistant Examiner*—S. V. Clark
*Attorney, Agent, or Firm*—Kevin D. Martin

[57] ABSTRACT

The invention comprises a semiconductor package which allows pinouts and bond options to be customized after the encasement of a die in plastic, ceramic, or other suitable materials. A first embodiment of the invention has a first assembly comprising an encapsulated die having bond pads connected to bond wires which terminate in exterior pad portions on the exterior of the encapsulant. Conductive paths which are part of a second assembly electrically connect with the exterior pad portions of the first assembly and pass signals to device pinouts, which can be leads or other connecting means, to an electronic device into which the module is installed. By selectively connecting the exterior pad portions of the first assembly to the connection points of the conductive paths of the second assembly, the device pinouts and bond options can be selected. To manufacture a device having different pinouts or bond options, a bottom section having a different design is used.

20 Claims, 7 Drawing Sheets

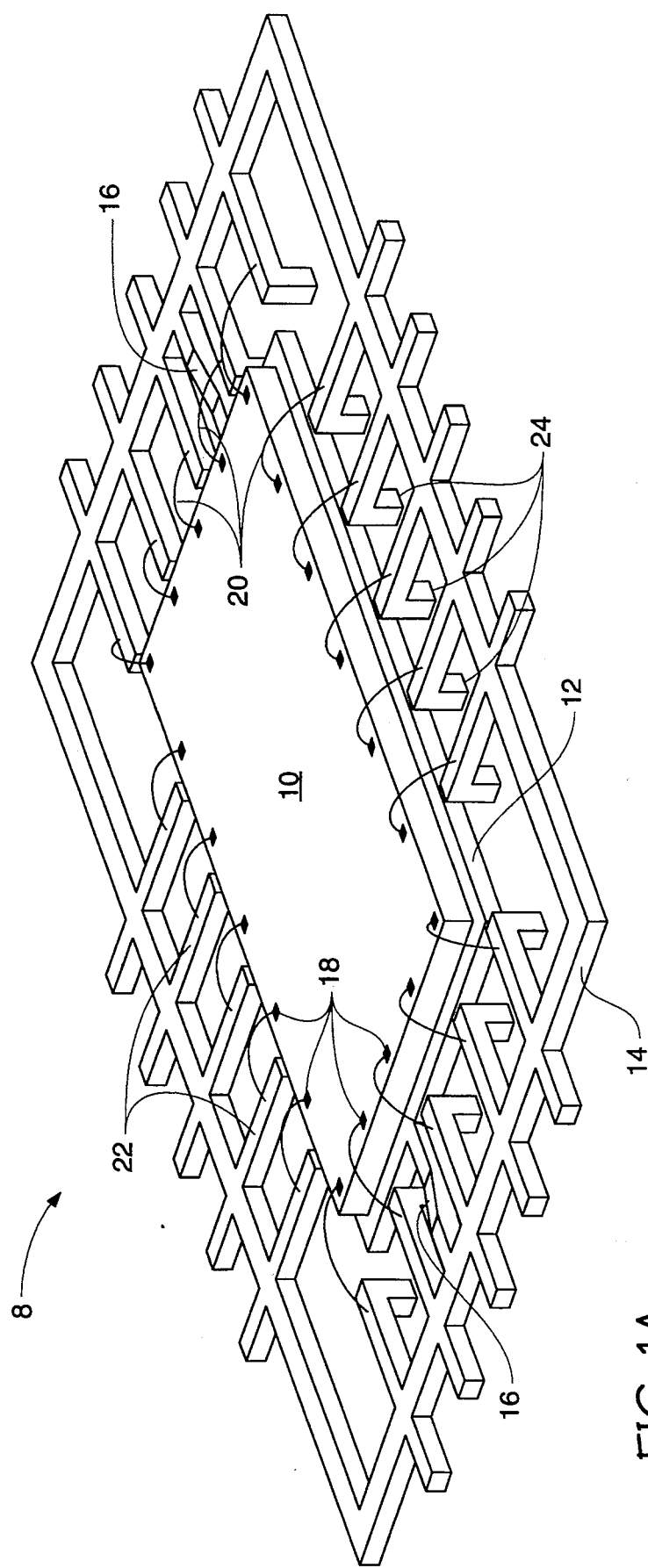
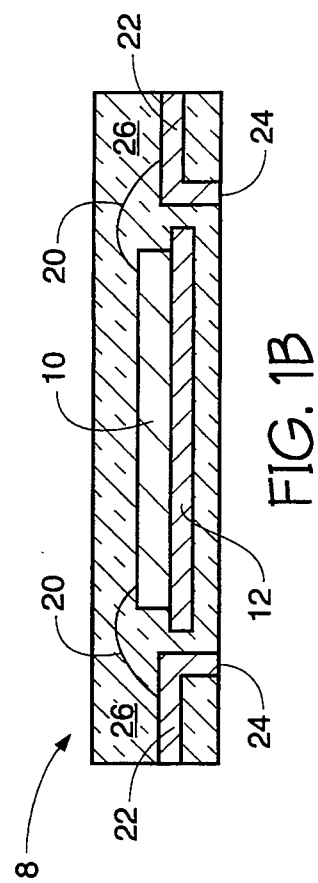
FIG. 1A
FIG. 1B

5,360,992

TWO PIECE ASSEMBLY FOR THE SELECTION OF PINOUTS AND BOND OPTIONS ON A SEMICONDUCTOR DEVICE

CROSS REFERENCE TO RELATED APPLICATION

This is a continuation of application Ser. No. 07/811,768, filed Dec. 20, 1991, now abandoned.

FIELD OF THE INVENTION

This invention relates to the field of semiconductor packaging. More specifically, several semiconductor package design embodiments are described which allow for various backend- and user-selectable wire bond options and pinouts.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of semiconductor devices being manufactured. This process yields a number of die on each wafer produced. The die are separated with a wafer saw, and then packaged into individual components.

During the packaging process, several semiconductor die are attached to a lead frame, often with materials such as conductive epoxy, various metals and alloys, or other adhesives. Bond wires electrically connect (i.e. couple, directly or through intermediate paths) a number of bond pads on each die to conductive lead "fingers" on the lead frame. Leads are interposed between the lead fingers and the host into which the device is installed. The die, the wires, and a portion of the leads are encapsulated in plastic. The leads on the lead frame connect the die with the device into which the component is installed, thereby forming an electrical pathway and a means of input/output (I/O) between the die and the host.

The particular lead finger with which a bond pad is connected determines the pinout for that bond pad. For example, in a dynamic random access memory (DRAM) if a bond pad on the die which corresponds to Address 0 (A0) is bonded to the lead finger corresponding to Output Pin 5, then pin 5 on the package is used as A0. This hardwires the bond pad on the die to the output of the lead frame, and remains that way for the life of the package. Once the die is encapsulated, the output pins for the signals required to operate the die cannot be changed.

In addition to providing external access to standard input and output signals, the wire bond step may also be used to select various optional operating features of an integrated circuit (IC) product (such as a DRAM). In the case of a DRAM IC, device data width may be selected at the wire bond step thereby determining whether the die is written to and read from, for example, 1 or 4 bits at a time. A 4 megabit (Mbit) device, therefore, can be configured as a 4Mbit×1 or a 1Mbit×4, depending on how the bond pads are wire bonded to the lead frame.

Fast page mode is another option which might be selected at wire bond. Fast page mode allows for two or more successive reads or writes from the same row without requiring another row address strobe (RAS) signal. For example, if RAS is kept low after a read, another cell or plurality of cells in the row can be read by issuing a different address on the address lines and then toggling the column address strobe (CAS), thus executing faster memory access cycles.

Similarly, static column mode might be selected at the wire bond stage. Static column mode is similar to fast page mode, but both RAS and CAS remain low, and a new address is presented to the address lines in order to read from or write to a different address in the row. Various other device modes and options are selected during the wire bond step. Sometimes a bond pad is not connected with an output lead, and the option is not selected.

One problem with selecting options by wire bonding an option into a package is that once the die is encapsulated the package options cannot be changed. Various customers require a different combination of options or a number of different package options. The manufacturer must either assemble the package as the order is placed, or the manufacturer or buyer must keep a stock of each of the various device types. Assembling the devices as they are ordered implies long lead times, while keeping a large stock increases operating costs of the manufacturer or the buyer.

Devices have been designed which allow for the selection of bond options after packaging of the die using an electrical in-package late programming technique. To fabricate this type of part, the die is attached to the lead frame and the die is encapsulated in plastic. Circuitry on the die allows the bond option to be electrically selected. Using this technique, however, only options that are compatible with the package pin count in which the part was assembled are selectable.

A package which allows the semiconductor manufacturer or buyer to package a die and configure bond options and pin counts as they are required would help solve the problems listed above. Note that even though many of the devices used as examples herein specifically mention die encapsulated in plastic, similar problems and solutions are workable for die housed in ceramic or other package materials.

SUMMARY OF THE INVENTION

One embodiment of the invention comprises the use of an inventive two-piece package. In some embodiments, the addition of a third middle section as described herein may have advantages over the two piece embodiments.

A first assembly comprises a semiconductor die encased in plastic, ceramic, or other suitable material. All available bond options (bond pads) are routed to the exterior portion of the package by a first assembly frame. Portions of the first assembly frame are exterior to the encasement and terminate in exterior pad portions which can be conductively bonded to.

A second assembly of the invention comprises a second assembly frame which provides a means of input/output (I/O) between the die and the host into which it is installed. The second assembly frame comprises conductive paths to which the exterior pad portions are connected, the first assembly being conductively mounted to the second assembly thereby. With the two-piece embodiment of the invention, the frame of the second assembly determines the pinouts (the pin numbers associated with each of the signals of the device) of the various signals of the die contained within the first assembly.

An optional third assembly, which, if used, is interposed between the first and second assemblies, comprises means for "keying" the exterior pad portions to desired locations on the second assembly frame. The third assembly can comprise at least two different embodiments.

In a first embodiment, the third assembly is a nonconductive membrane having voids therethrough. The conductive paths of the second assembly are located in an "X" direction, while the exterior pad portions of the first assembly of this embodiment are bars extending in a "Y" direction. By selectively placing the voids in the membrane, the pads of the first assembly can either be connected with the conductive paths of the second assembly, or isolated from the conductive paths if no void is formed. Using said X-Y arrangement, any of the bond options can be connected with any of the pinouts. Connecting is accomplished by coating the bars with a conductive material and interposing the insulative membrane between the first and second assemblies. The conductive material fills the voids, thereby passing signals between the first and second assemblies.

In a second embodiment, the third assembly comprises a flex circuit as used with tape automated bonding. The second assembly has a single design, and the layout of the flex circuit determines the pinouts and options of the semiconductor device. The flex circuit is conductively mounted to the first and second assemblies in a fashion consistent with tape automated bonding (TAB) technology, for instance with solder, or by some other means such as the Z-axis conductive epoxy described below. This nonmetallic material is conductive in a Z direction (vertically), but is substantially nonconductive in an X-Y direction (horizontally).

BRIEF DESCRIPTION OF THE DRAWINGS

FIG. 1A is an isometric view, and 1B is a cross section, showing a die mounted and wire bonded to a first assembly frame as used with the inventive device, which is then hermetically sealed in an encasement;

DETAILED DESCRIPTION OF THE INVENTION

Figure 2A:
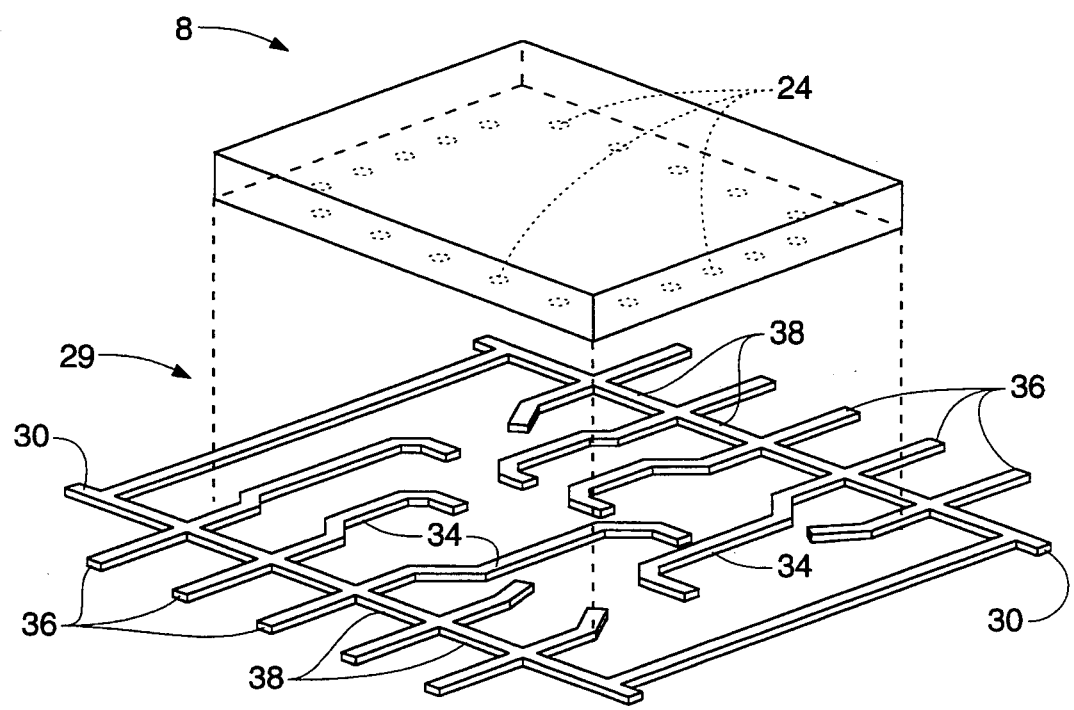
FIG. 2A is an exploded view of a two piece embodiment of the invention which has a first assembly directly connected with the second assembly with solder or other workable means.

The invention comprises at least two assemblies. FIGS. 1A and 1B show one embodiment of a first assembly, generally described as element 8. In this embodiment of a die-first assembly frame attachment, the die 10 is supported by a die paddle 12. The paddle 12 is connected to the frame 14 by a tie bar 16 as is known in the art. Bond pads 18 on the die 10 are wire bonded 20 to lead fingers 22 of the lead frame 14. Other embodiments having a die flip-chip mounted to the lead frame may provide advantages. In any case, the lead fingers 22 terminate in exterior conductive pads 24 which are exterior to the first assembly 8. The pads 24 in the embodiments shown herein are flush with the exterior of the package (element 26 in FIG. 1B), although other embodiments are possible. For example, the lead fingers 22 could terminate in J-leads, or other types of leads to form the exterior pads.

A ceramic embodiment of this first assembly is possible and would serve a similar function, the bond pads on the die being connected by bond wires to traces running through the ceramic body, and terminating in pads or leads on the exterior of the first assembly. In the ceramic embodiment, a lid would be required to hermetically seal the die in the ceramic body as is presently known in the art of semiconductor technology.

In various embodiments of the invention, more than one bond pad may connect with a single exterior pad, or more than one exterior pad can connect with a single bond pad. More often, however, one bond pad will connect with a single lead finger, which will terminate in a single pad on the exterior of the package. These exterior pads allow for an electrical signal to pass between the die and a second assembly described below. On a DRAM, these signals could comprise addresses, power, ground, and bond options such as data width and other device modes (page mode, fast page mode, write-per-bit, etc.). Other signals are possible and likely on other types of semiconductor devices such as static RAMs (SRAMS), microprocessors, and other logic and memory.

Figure 2B:
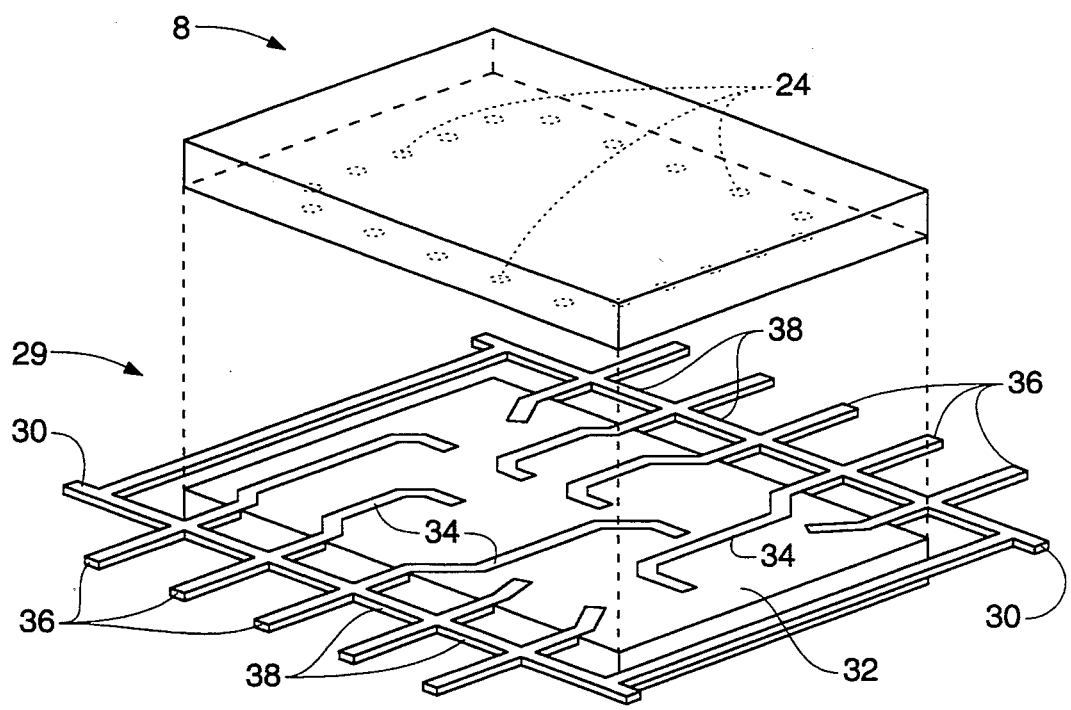
FIG. 2B shows the embodiment of 2A with the second assembly supported by a nonconductive material such as plastic or ceramic.

An embodiment of a second assembly of the invention, generally labeled as element 29 as shown in FIG. 2A comprises a second assembly frame 30 which would most often be manufactured from a conductive material such as a copper alloy. A ceramic, plastic, or other nonconductive material 32 can be added to the second assembly to support the elongated conductive paths 34, as shown in FIG. 2B, and prevent them from bending or shorting together. The paths 34 connect with the exterior pads 24 of the first assembly. As this second assembly is manufactured from a conductive material, connecting with the first assembly can occur at any point along a path 34. The paths 34 of the second assembly are connected with (or are formed into) outputs 36 which will connect with an electronic host into which the inventive device is installed. Connection of the exterior pads 24 of the first assembly and the paths 34 of the second assembly are accomplished by any workable means, such as by reflowing solder bumps formed on the exterior pads 24 of the first assembly or by using a conductive adhesive such as a Z-Axis Conductive Adhesive available from Zymet of E. Hanover, N.J. In any case, the paths 34 are routed between the exterior pads 24 of the first assembly to avoid undesired contact with other paths. With this two-piece embodiment, if an exterior pad 24 comprises a bond option which is not desired, a path 34 will not be located below it, and therefore it will not make contact therewith; since the exterior pad 24 is not connected with a path 34, this bond option would not be selected. Also, selection of a pinout for a particular signal is accomplished simply by connecting a pad 24 of the first assembly with the path 34 of the second assembly corresponding to that pinout. To move the signal to a different pinout, (a different output) a different second assembly is substituted. After the first and second assemblies are connected, the tie bars 38 of the lower assembly are trimmed to isolate each of the outputs 36. The outputs 36 are then formed into a desired configuration, such as zigzag inline (ZIP), dual inline (DIP), gull wing, or other lead types. FIGS. 2a and 2b show a complete second assembly frame before a trim and form step. In either case, the unnecessary metal of the second assembly frame is trimmed away to disconnect each of the outputs 36, and the outputs 36 are then formed into a desired shape. With the inventive semiconductor device, different device pinouts can be selected after the die has been encapsulated in plastic or encased in ceramic or another suitable material.

Figure 3:
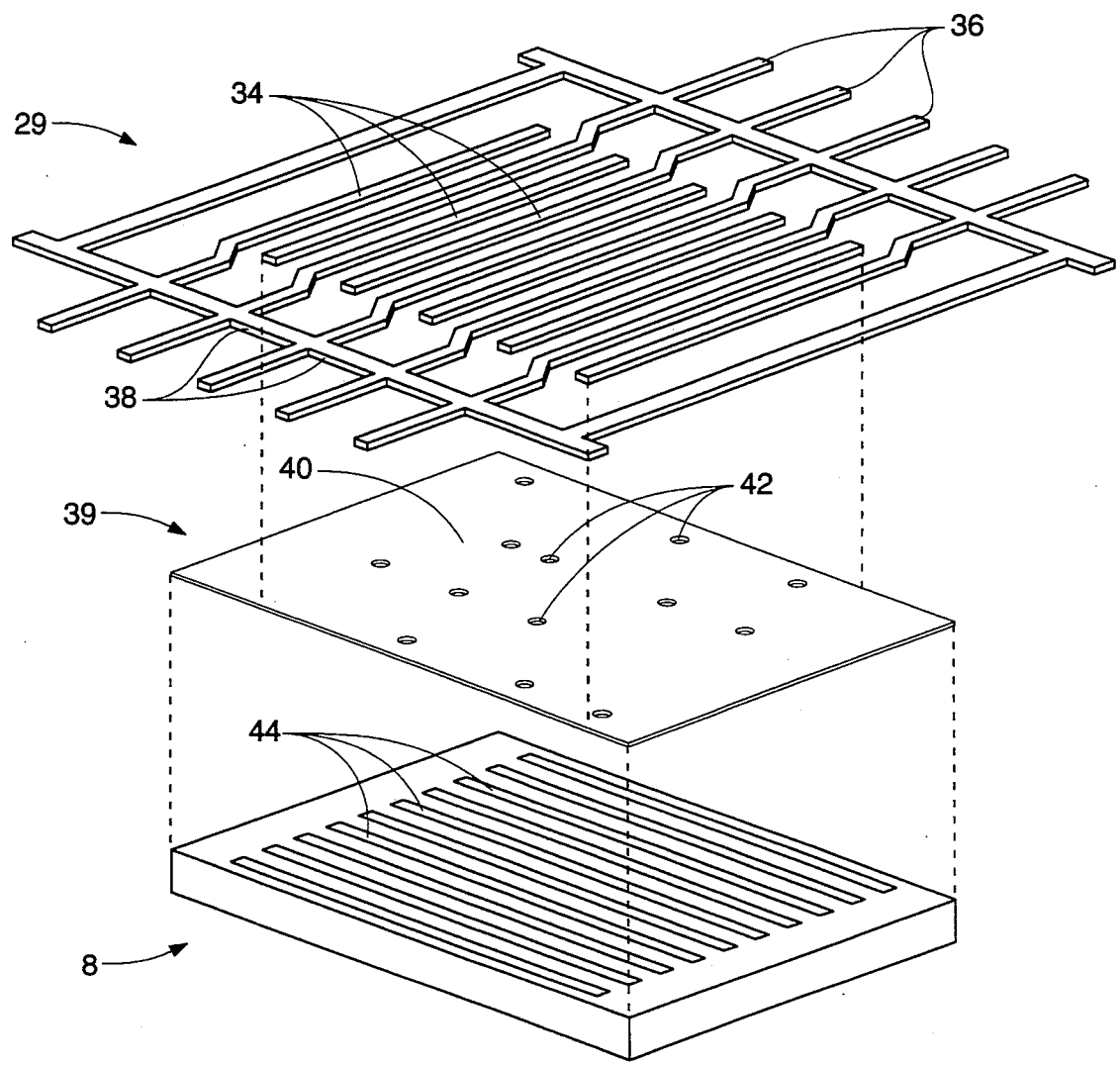
FIG. 3 is an exploded view (inverted from the view of FIGS. 1 and 2 to show detail of the first assembly) of a three piece embodiment of the invention having a thin insulative membrane with voids therein to receive a conductive material which electrically connects the first and second assemblies.

An inventive embodiment comprising an optional third assembly, generally described as element 39 may have advantages. A first embodiment of this third assembly 40, as shown in FIG. 3 (inverted to show detail of the first assembly 8), is manufactured from a substantially insulative material such as polyimide or plastic, and contains a number of holes or voids 42 through which a conductive substance (not shown) can pass to connect the pads 44 on a second embodiment of the first assembly with the paths 34 on the second assembly 29. Each exterior pad 44 of the first assembly 8 of this embodiment is connected with a bond pad on the die, and, as with the first embodiment, usually only one bond pad of the die will be connected with one pad 44 of the first assembly. The pads 44 of the first assembly and paths 34 of the second assembly form a grid. By placing the holes 42 in the membrane 40 in a particular location, any of the conductive pads 44 of the first assembly can be connected with any of the paths 34 of the second assembly to select any of the bond options and pinouts available on the die. The conductive pads 44 of the first assembly extend in a substantially X direction, while the paths 34 of the second assembly extend in a substantially Y direction, thus making possible the connecting of any bond option to any pinout.

For example, to provide a device having a pin 7 ground signal, a hole is placed in the membrane at the junction of the pad 44 which is connected with the ground bond pad on the die, and the pin 7 bar of the second assembly.

Holes 42 in the membrane 40 are filled with conductive material (not shown) and connect selected pads 44 to the paths 34. By using membranes 40 having different designs (i.e. holes 42 in different locations) different pads 44 can be connected with the paths 34 on the second assembly. The conductive substance which fills the voids 42 in the membrane 40 and connects the pads 44 with the paths 34 could comprise a metal-based material such as solder, a curable silver-glass conductive paste such as that available from Johnson-Matthey of San Diego, Calif., or the Z-axis conductive epoxy available from Zymet described above, or other workable means.

Figure 4:
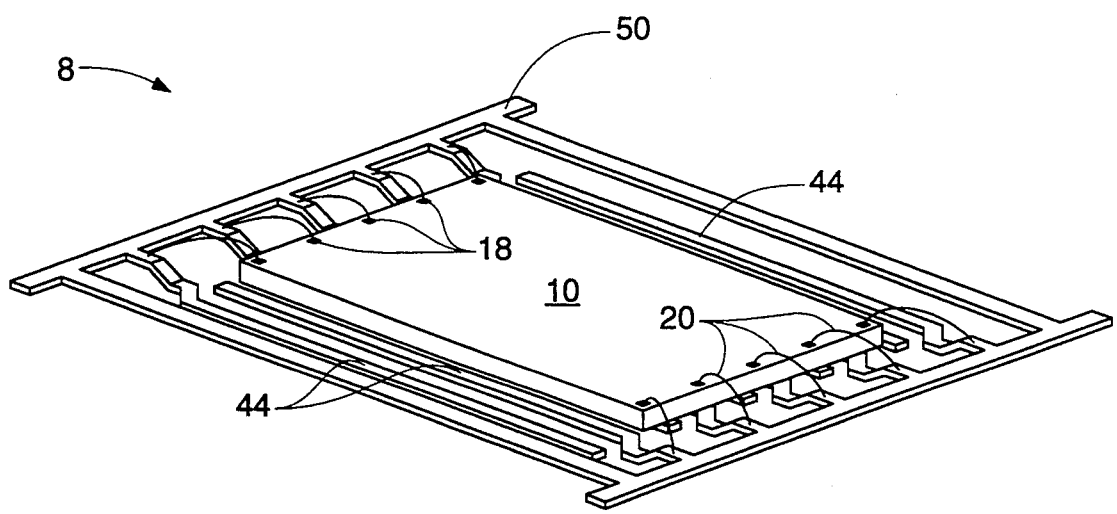
FIG. 4 is an isometric view of the die-first assembly frame assembly of FIG. 3 before encapsulation.

FIG. 4 shows the die-first assembly frame attachment of the first assembly 8 of the FIG. 3 embodiment. Each bond pad 18 on the die 10 is connected with a conductive pad 44 or pads with a bond wire 20 or wires. The conductive pads 44 themselves replace the die paddle 12, thus supporting the die 10. A substance such as a nonconductive epoxy or Kapton ® tape mechanically supports the die 10 on the pads 44. The die 10 is wire bonded 20 to the first assembly frame 50. The die, bond wires, and a portion of the pads 44 are then encased in plastic or other suitable material. A ceramic embodiment of the inventive first assembly is also possible, and can be easily constructed from this description by an artisan of skill in the art.

Figure 5:
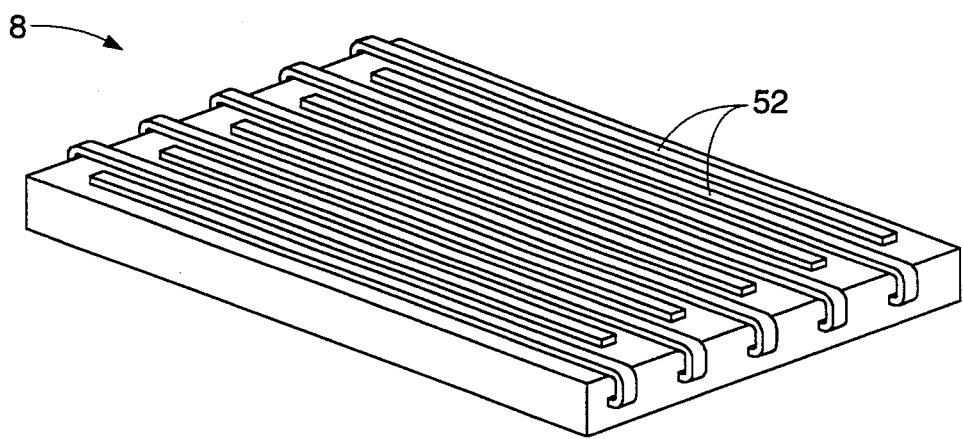
FIG. 5 is an isometric view of an alternate method of forming the first assembly of FIG. 3.

FIG. 5 shows a third embodiment of the first assembly 8 of FIG. 3. In this embodiment, the die (not shown) is placed on the paddle (not shown) of a first assembly frame (not shown), the frame having extremely long paths 52. The die, die paddle, and a portion of the frame are encased in plastic or other material, then the pads 52 are formed and adhered to the encasement material to form the first assembly 8. Attachment to the second assembly with the first assembly is accomplished in a manner similar to that of FIG. 3.

Another embodiment of the first assembly for use with the embodiment as shown in FIG. 3 uses the first assembly of FIG. 1B. After forming the first assembly of FIG. 1B, lines are formed by patterning a conductive material such as conductive epoxy, conductive paste (such as silver-filled paste), conductive ink or any other workable material to form lines similar to 44 as shown in the first assembly 8 of FIG. 3. The lines couple with the exterior pads 24 as shown on FIG. 1B.

Figure 6:
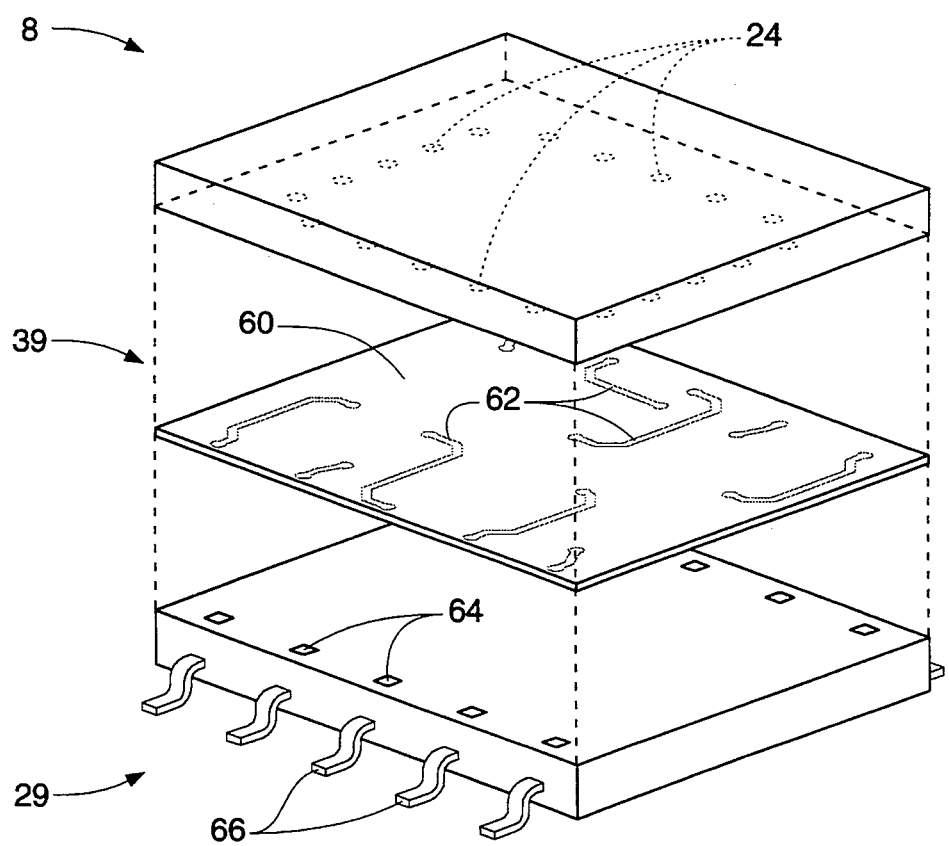
FIG. 6 is an exploded view of a three piece embodiment of the invention having a flex circuit interposed between the first and second assemblies which routes the signals from the first assembly to the appropriate conductive paths on the second assembly.

In accordance with FIG. 6, another inventive embodiment which may have advantages is to manufacture the third assembly 39 from a flex circuit 60 using tape automated bonding (TAB) techniques. This embodiment shows a first assembly of FIG. 1 with additional pads 24 manufactured therein. Using this arrangement, changing the design of the second assembly 29 to change outputs would not be required, but a flex circuit 60 having different trace 62 routings would connect exterior pads 24 on the first assembly 8 with paths 64 on the second assembly. In this embodiment, long paths on the second assembly would not be required which may solve problems of lead movement associated in conventional lead frame designs that may be present in the inventive second assembly if the paths are not supported with an insulative material. With the FIG. 6 embodiment, a second assembly is standard within output lead 66 types, and could comprise any number of lead types including ZIP, DIP, single inline (SIP), J-leads, or leadless chip carrier (LCC). To change pinouts or device options, a flex circuit 60 having a different design would be used during the assembly of the device. The first and second assemblies would be connected to the flex circuit 60 using solder techniques known in the art, or by using other materials.

Typical TAB technology employs one or more layers of copper or alloy traces 62 interposed between two or more layers of nonconductive material such as plastic or polyimide. On the top and bottom of the TAB tape are first and second ends where the traces are not covered, which allows for connecting with a conductive material such as solder. To facilitate bonding of the copper or alloy traces with the tin/lead solder, these exposed trace areas are often flashed with layers of gold or platinum chromium, copper, tungsten, nickel, or gold, and solder bumps for reflow are formed over the flashing. Alternately, a Z-axis conductive adhesive can be interposed between the first assembly and the flex circuit, and/or between the second assembly and the flex circuit. This adhesive would electrically connect the pads and paths of the first and second assemblies to the traces in a vertical direction, while providing an adhesive and an insulator in a horizontal direction.

The semiconductor devices as described above provide a means for allowing pinouts and wire bond options to be selected after the die is hermetically sealed. The invention is a relatively thin device, and would allow the pinouts and bond options to be selected late in the manufacturing process by the semiconductor manufacturer or a large scale semiconductor user.

What have been described are specific configurations of the invention, as applied to particular embodiments. Clearly, variations can be made to the original designs described in this document for adapting the invention to other embodiments. For example, various materials can be used for encapsulation, adhesion, and conductance, and the device can comprise a zig-zag inline package, dual inline package, gull wing package, leadless chip carriers, or a number of other pin types. Additional mechanical attachments for connection of the first and second assemblies are possible. Also, the die as described can comprise several unsingularized die on a section of wafer material, or a number of singularized die. Therefore, the invention should be read as limited only by the appended claims.

We claim:

1. A semiconductor device, comprising:
   a) a first assembly comprising:
      i) a wafer section with bond pads for the passage of signals therethrough;
      ii) a first assembly frame supporting said wafer section, said first assembly frame having conductive pads;
      iii) means for electrically connecting said bond pads with said first frame assembly;
   wherein said wafer section, said means for electrically connecting, and a portion of said first assembly frame are hermetically sealed within a protective encasement, said conductive pads having portions exterior to said encasement, wherein said first assembly frame is electrically connected to said exterior pad portions;
   b) a second assembly comprising a second assembly frame, said second assembly frame comprising:
      i) outputs for connecting with an electronic device into which said semiconductor device is installed;
      ii) a plurality of conductive paths, each of said conductive paths routing one of said signals between one of said external pad portions and one of said outputs,
   wherein a design of said conductive paths determines which one of said signals passes through each of said outputs.

2. The semiconductor device of claim 1 wherein said means for electrically connecting said wafer section inputs and outputs with said first frame assembly comprises a bond wire.

3. The semiconductor device of claim 1 wherein said conductive paths are electrically connected to said exterior pad portions with solder.

4. The semiconductor device of claim 1 wherein said conductive paths are electrically connected to said exterior pad portions through a nonconductive sheet having voids therein, said voids receiving a conductive material which connects said exterior pad portions with said conductive paths.

5. The semiconductor device of claim 1 wherein said conductive paths comprise bars for making an electrical connection anywhere along said bars.

6. The semiconductor device of claim 1 further comprising a third assembly interposed between said first assembly and said second assembly, said third assembly comprising traces, each trace having first and second ends with said first end of one of said traces electrically connected to one of said conductive pads, and said second end connected to one of said conductive paths, said conductive path being electrically connected to said conductive pad through said trace.

7. The semiconductor device of claim 1 wherein said protective encasement comprises plastic and wherein a portion of said second assembly is encapsulated in plastic.

8. The semiconductor device of claim 1 wherein said protective encasement comprises ceramic and wherein said second assembly further comprises ceramic to support said conductive paths.

9. The semiconductor device of claim 1 wherein said wafer section is connected to said first assembly frame by flip chip bonding.

10. A semiconductor device, comprising:
    a) a first assembly comprising:
       i) a wafer section with bond pads for the passage of signals therethrough;
       ii) a first assembly frame supporting said wafer section, said first assembly frame having conductive pads;
       iii) bond wires electrically connecting said bond pads with said first assembly frame;
    wherein said wafer section, said bond wires, and a portion of said first assembly frame are hermetically sealed within a protective encasement, said conductive pads having portions exterior to said encasement, wherein said first assembly frame is electrically connected to said exterior pad portions;
    b) a second assembly comprising a second assembly frame, said second assembly frame comprising:
       i) outputs for connecting with an electronic device into which said semiconductor device is installed;
       ii) a plurality of conductive paths, each of said conductive paths routing one of said signals between one of said exterior pad portions and one of said outputs,
    wherein said signals are routed between said exterior pad portions and said outputs by said conductive paths, and a design of said conductive paths determines which one of said signals passes through each of said outputs.

11. The semiconductor device of claim 10 wherein said conductive paths are electrically connected to said exterior pad portions with solder.

12. The semiconductor device of claim 10 wherein said conductive paths are electrically connected to said exterior pad portions through a nonconductive sheet having voids therein, said voids receiving a conductive material which connects said conductive pads with said conductive paths.

13. The semiconductor device of claim 10 wherein said conductive paths comprise bars for making an electrical connection anywhere along said bars.

14. The semiconductor device of claim 10 further comprising a third assembly interposed between said first assembly and said second assembly, said third assembly comprising traces, each trace having first and second ends with said first end of one of said traces electrically connected to one of said exterior pad portions, and said second end connected to one of said conductive paths, said conductive path being electrically connected to said exterior pad portion through said trace.

15. The semiconductor device of claim 10 wherein said protective encasement comprises plastic and wherein a portion of said second assembly is encapsulated in plastic.

16. The semiconductor device of claim 10 wherein said protective encasement comprises ceramic and wherein said second assembly further comprises ceramic to support said conductive paths.

17. A semiconductor memory device, comprising:
   a) a first assembly comprising:
      i) a semiconductor die with bond pads, said bond pads for the passage of signals therethrough, each of said bond pads having a different signal passing therethrough, said signals comprising bond options and addresses;
      ii) a first assembly frame supporting said semiconductor die, said first assembly frame having conductive pads;
      iii) bond wires electrically connecting said bond pads with said first assembly frame;
      wherein said semiconductor die, said bond wires, and a portion of said first assembly frame are hermetically sealed within a protective encasement, said conductive pads having portions exterior to said encasement, wherein said first assembly frame is electrically connected to said exterior pad portions;
   b) a second assembly comprising a second assembly frame, said second assembly frame comprising:
      i) pinouts for connecting with an electronic device into which said semiconductor device is installed;
      ii) a plurality of conductive paths, each of said conductive paths routing one of said signals between one of said exterior pad portions and one of said pinouts,
   wherein said signals are routed between said outputs and said exterior pad portions by said conductive paths, and a design of said conductive paths determines which one of said signals passes through each of said outputs.

18. The semiconductor device of claim 17 wherein said protective encasement comprises plastic and wherein a portion of said second assembly is encapsulated in plastic.

19. The semiconductor device of claim 17 wherein said protective encasement comprises ceramic and wherein said second assembly further comprises ceramic to support said conductive paths.

20. The semiconductor device of claim 17 wherein said pinouts have signals from only one semiconductor die passing therethrough.

* * * * *